United States Patent [19]

Colvin et al.

[11] 4,015,880
[45] Apr. 5, 1977

[54] MULTIPLE LEVEL FLUID BEARING TRACK ASSEMBLY

[75] Inventors: Ronald L. Colvin, Mesa; James H. Williams, Tempe, both of Ariz.

[73] Assignee: The United States of America as represented by the Secretary of the Air Force, Washington, D.C.

[22] Filed: May 21, 1975

[21] Appl. No.: 579,746

[52] U.S. Cl. .............................. 302/31; 104/23 FS; 214/1 BE
[51] Int. Cl.² ........................................ B65G 53/04
[58] Field of Search .......... 302/2 R, 31; 214/1 BE; 104/134, 23 FS; 193/1, 35 R, 35 C

[56] References Cited

UNITED STATES PATENTS

| 3,391,769 | 7/1968 | Anderson | 193/1 |
|---|---|---|---|
| 3,633,805 | 1/1972 | Vaghi | 226/76 |
| 3,718,371 | 2/1973 | Lasch, Jr. | 302/31 |

OTHER PUBLICATIONS

IBM Technical Disclosure Bulletin – T. Kenagioglou & D. E. Lonser– vol. 17, No. 8– Jan. 1975– p. 2319.

Primary Examiner—Frank E. Werner
Attorney, Agent, or Firm—Joseph E. Rusz; Jacob N. Erlich

[57] ABSTRACT

A multiple level fluid bearing track assembly having a plurality of shoulders thereon to form an upper and lower level for transporting articles of various sizes. A plurality of fluid jet inserts are incorporated within the track assembly to provide the necessary lift and motive force to the article to be transported. With the multiple level track assembly of this invention a variety of different sized articles can therefore be interchangeably or simultaneously transported without the physical alteration of the track assembly.

3 Claims, 3 Drawing Figures

MULTIPLE LEVEL FLUID BEARING TRACK ASSEMBLY

STATEMENT OF GOVERNMENT INTEREST

The invention described herein may be manufactured and used by or for the Government for purposes without the payment of any royalty thereon.

BACKGROUND OF THE INVENTION

This invention relates generally to a fluid bearing track assembly, and, more particularly to a multiple level air bearing track assembly capable of interchangeably and/or simultaneously transporting silicon wafers of various diameters commonly used in the electronics industry.

Fluid bearing track assemblies find great utility in handling or transporting various articles, particularly fragile articles which do not lend themselves readily to manual handling during processing or treatment thereof. One such area of use for fluid bearing track assemblies is in the processing of semiconductor wafers, commonly used in the electronics industry in the manufacture of integrated circuits, transistors and semiconductor devices, during movement of such wafers between predetermined locations at which various operations and manufacturing activities are performed.

In particular, in the automated system for epitaxial deposition of silicon-on silicon wafers, wafers of varying diameters must be transported between a plurality of processing stations. Such an automated system operates under the supervisory control of a computer and operates without interruption. The automated functions incorporated within the system include a wafer cleaning station, surface inspection station for contamination, reactor station and evaluation station for electrical and physical characteristics of the wafer.

Heretofore, the fluid bearing assembly utilized to transport wafers between stations had to be physically or mechanically altered to accommodate the wafers of different diameters. Such a procedure considerably affects the operation of the automated wafer processing system. Not only does the inability of past fluid bearing transport assembly fail to accommodate various sized wafers and thereby substantially reduce the overall speed of operation of wafer processing equipment, but also past transport assemblies required additional operators to insure the efficient, reliable operation of the entire system. It is therefore clearly evident that the addition of a fluid bearing transport assembly capable of transporting various diameter silicon wafers without having to physically change the structure of the air bearing would greatly improve overall reliability and economy of operation, especially in the area of automated processing of semiconductor wafers.

SUMMARY OF THE INVENTION

The instant invention overcomes the problems set forth in detail hereinabove by providing a multiple level fluid or air bearing track assembly capable of transporting various diameter articles such as silicon wafers without having to physically change the bearing geometry or configuration of the track whenever different diameter wafers are processed.

The air bearing track assembly of this invention is constructed of a track having an upper and lower level and a plurality of directional air jet inserts. The upper and lower levels of the track assembly take the form of a plurality of shoulders spaced a predetermined distance apart so as to create a pair of surfaces for the transporting of various sized articles, in particular, silicon wafers of various diameters. The air jet inserts are contained within cutouts or slots located in the body of the track and are supplied with air from any suitable air source. The fluid such as air emanating from the jet inserts are directed upward at an angle of 30° from the horizontal thereby giving sufficient lift and movement to the articles to be transported. Wafers of, for example, 2 inch diameter can be transported on the lower level of the track by a single air jet insert while larger wafers of, for example, 3 inches in diameter can be transported on the upper level by a pair of outer air jet inserts.

As a result of the track configuration of this invention articles of various diameters can be readily transported either singly or in parallel if desired. In addition, with the insertion of a supporting section within the lower level of the air bearing track assembly of this invention, the instant invention can be enlarged to accommodate additional wafers of even greater diameter.

It is therefore an object of this invention to provide a multiple level air bearing track assembly capable of transporting articles of various sizes.

It is another object of this invention to provide a multiple level air bearing track assembly which does not require the physical alteration of the track in order to accommodate wafers of various diameters.

It is still another object of this invention to provide a multiple level air bearing track assembly which eliminates the use of any moving parts in order to receive and transport the various sized wafers.

It is still a further object of this invention to provide a multiple level air bearing track assembly which is economical to produce, extremely reliable in operation and which utilizes conventional, currently available components that lend themselves to standard mass producing manufacturing techniques.

For a better understanding of the present invention together with other and further objects thereof reference is made to the following description taken in conjunction with the accompanying drawing and its scope will be pointed out in the appended claims.

DETAILED DESCRIPTION OF THE PREFERRED EMBODIMENT

Figure 1:
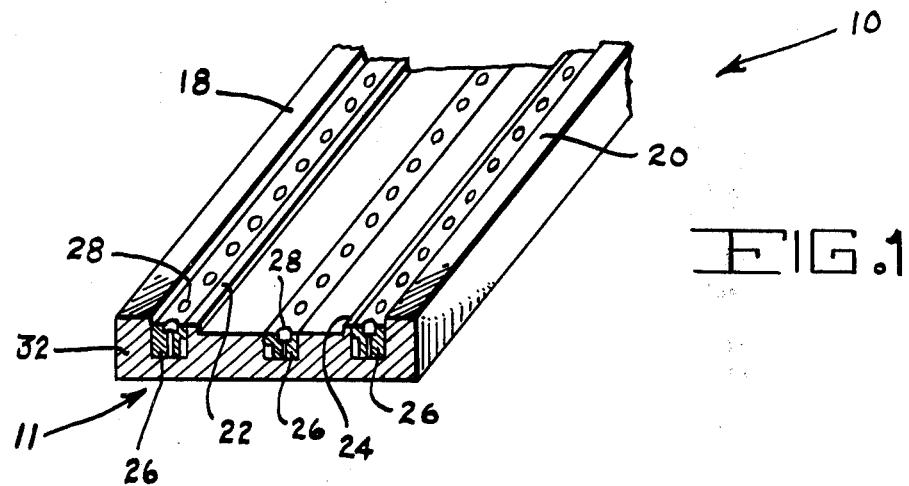
FIG. 1 is a pictorial representation of a section of the multiple level air bearing track assembly of this invention shown partly in cross section.
Figure 2:
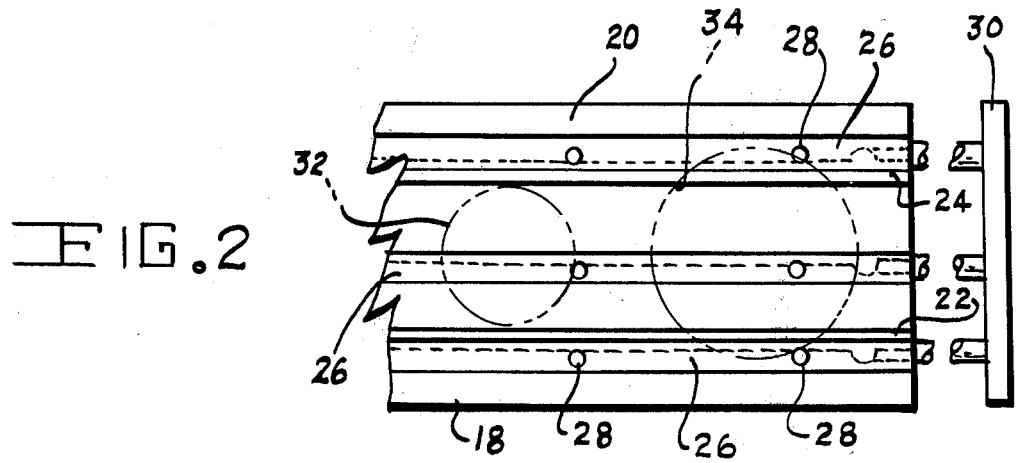
FIG. 2 is an enlarged plan view of a section of the multiple level air bearing track assembly of this invention showing a pair of wafers having different diameters positioned thereon.
Figure 3:
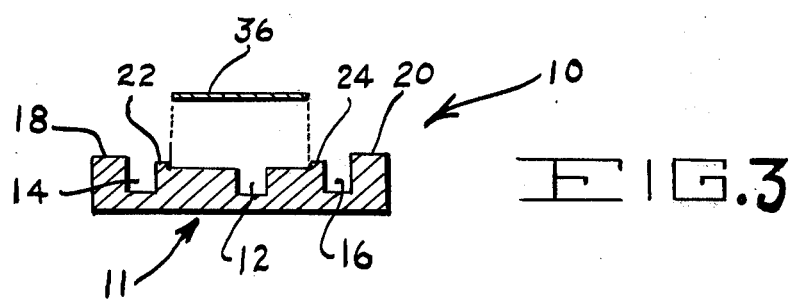
FIG. 3 is a cross section of the multiple level air bearing track assembly of this invention with the jet inserts removed therefrom and with a support insert being shown in exploded fashion.

Reference is now made to FIG. 1 of the drawing which best shows the multiple level air bearing track assembly 10 of this invention. Track assembly 10, as seen in FIG. 3 of the drawing, is made of a body 11 manufactured, preferably, from a single piece of material and having a plurality of shoulders and cutout portions therein. A first cutout portion 12 is formed along the central longitudinal axis of body 11 and a pair of cutouts 14 and 16 are situated on opposite sides thereof forming end shoulders 18 and 20 and intermediate shoulders 22 and 24. These cutouts 12, 14 and 16 are shown in FIGS. 1 and 2 accommodate fluid or air jet inserts 26. Jet inserts 26 have a plurality of openings 28 therein and are attached to any conventional air source 30 (shown in FIG. 2) to provide the necessary lifting and motive force for the articles to be transported in a manner to be described hereinbelow.

As clearly shown in FIGS. 1 and 3, located intermediate shoulders 22 and forming the lower level of track 10 is a raised base 32 which supports thereon the smaller diameter wafer 32 (FIG. 2). Shoulders 22 and 24 are of a height slightly less than the height of end shoulders 18 and 20 and form the guide rails for wafer 32. A larger diameter wafer 34 (FIG. 2) is supported upon shoulders 22 and 24 thereby forming the upper level of track 10 with end shoulders 18 and 20 acting as the guide rails therefore. In this manner wafers 32 and 34 can be transported either between shoulders 22 and 24 or between end shoulders 18 and 20 without any physical alteration of track assembly 10.

In some instances, if the supporting areas of shoulders 22 and 24 are too small to provide a sufficient backing surface for a large diameter wafer transported on air bearing track assembly 10 of this invention, a support insert 36 can be matingly located between the areas of shoulders 22 and 24 in order to substantially increase the supporting surface for wafer 34. In such a case, however, the track assembly would be unable to accommodate a wafer of a different diameter until insert 36 has been removed.

In operation when it is desirable to transport articles of various sizes such as silicon wafers 32 and 34, no alteration of track assembly 10 is necessary. Central air jet insert 26 is utilized to propel wafer 32 along the lower level or middle segment of track assembly 10 while the dual air jet inserts 26 transport a larger size diameter wafer 34 along the upper level of bearing track assembly 10. In this manner larger and smaller sized wafers can be interchanged and transported either independently or simultaneously by means of the air bearing track assembly of this invention.

Although this invention has been described with reference to a particular embodiment, it will be understood to those skilled in the art that this invention is also capable of a variety of further embodiments which engage the essential features of this invention set forth hereinabove. For example, the body 11 may be manufactured from a plurality of elements rather than a single piece of material. In addition the overall size of air bearing track assembly 10 can be enlarged to accommodate wafers of even greater diameter by utilizing insert 36 and providing for additional end shoulders of greater height than shoulders 18 and 20.

We claim:

1. A multiple level fluid bearing track assembly for transporting articles of various dimensions comprising a body, said body having a centrally located longitudinally extending base portion of a predetermined height, a first pair of longitudinally extending shoulders adjacent said base portion, said base portion and said first pair of shoulders forming a lower level of said track assembly, first means for transporting articles of one dimension in a predetermined direction, said first transporting means being in the form of a longitudinally extending fluid jet insert located within said base portion intermediate said first pair of shoulders, said body having a second pair of longitudinally extending shoulders spaced a predetermined distance in the transverse direction from said first pair of shoulders, second means for transporting articles of another dimension in said same predetermined direction as said articles of said one dimension, said second transporting means being in the form of a pair of longitudinally extending fluid jet inserts of a height greater than said predetermined height of said base portion, each of said pair of inserts being located adjacent one of said second pair of shoulders, respectively, and forming in conjunction therewith an upper level of said track assembly whereby articles of various dimensions can be interchangeably or simultaneously transported in said predetermined direction by said track assembly.

2. A multiple level fluid bearing track assembly as defined in claim 1 further comprising a support insert removably positioned between said first pair of shoulders located on said base portion.

3. A multiple level fluid bearing track assembly as defined in claim 2 further comprising an air source operably connected to said plurality of fluid jet inserts.

* * * * *